(12) United States Patent
Liu et al.

(10) Patent No.: US 10,001,508 B2
(45) Date of Patent: Jun. 19, 2018

(54) INTEGRATED SELF-COINING PROBE

(71) Applicant: International Business Machines Corporation, Armonk, NY (US)

(72) Inventors: Yang Liu, Ossining, NY (US); Steven L. Wright, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 15/185,819

(22) Filed: Jun. 17, 2016

(65) Prior Publication Data

US 2017/0363659 A1  Dec. 21, 2017

(51) Int. Cl.
*G01R 1/073* (2006.01)

(52) U.S. Cl.
CPC ..... *G01R 1/07364* (2013.01); *G01R 1/07314* (2013.01)

(58) Field of Classification Search
CPC ............ G01R 1/07364; G01R 1/07314; G01R 1/07385; G01R 1/36; G01R 1/07307–1/07392; H01L 2924/00014; H01L 21/4853; H01L 21/7684; H01L 24/10; H01L 24/11; H01L 24/13; H01L 24/14; H01L 24/16; H01L 2224/10; H01L 2224/1184; H01L 2224/14051; H01L 2224/16; H01L 2224/16055; H01L 2224/16058; H01L 2224/0401; H01L 2224/1112; H01L 2224/1152; H01L 2224/11526; H01L 2224/13006; H01L 2224/13007; H01L 2225/1058; H01L 22/00; H01L 22/10; H01L 22/12; H01L 22/20; H01L 22/24; H01L 22/34

USPC ............ 324/754.01–754.31, 755.01–755.11, 324/756.01–756.07; 439/169, 170, 171, 439/182, 173, 174, 175; 438/14–18; 29/592.1, 825, 844, 845, 846, 850, 852, 29/861, 860, 874, 876, 877, 878, 879, 29/881, 882, 884; 257/734, 737, 738, 257/739, 752, 780, 758

See application file for complete search history.

(56) References Cited

U.S. PATENT DOCUMENTS 6,267,650 B1 * 7/2001 Hembree ................. B24B 7/22
                                                     257/E21.508
6,399,474 B1 * 6/2002 Tosaya ............... H01L 21/4853
                                                     257/738

(Continued)

*Primary Examiner* — Tung X Nguyen
*Assistant Examiner* — Lee Rodak
(74) *Attorney, Agent, or Firm* — Scully, Scott, Murphy & Presser, P.C.; Louis J. Percello, Esq.

(57) ABSTRACT

A probe head that contains a coining surface and a plurality of probe tips integrated on a same side of the probe head is provided. The probe head has a first portion and a laterally adjacent second portion, wherein the first portion of the probe head contains the coining surface, and the second portion of the probe head contains the plurality of the probe tips. Each probe tip may, in some embodiments, extend outwards from a probe pedestal that is in contact with the second portion of the probe head. The probe head is traversed across the surface of a semiconductor wafer containing a plurality of solder bump arrays such that the coining surface contacts a specific array of solder bumps prior to contacting of the same specific array of solder bumps with the probe tips.

8 Claims, 3 Drawing Sheets

(56) References Cited

U.S. PATENT DOCUMENTS

| | | | |
|---|---|---|---|
| 6,656,750 B1* | 12/2003 | Datta | B23K 1/0016 228/180.22 |
| 7,474,540 B1* | 1/2009 | Dang | H01L 23/147 174/250 |
| 8,525,168 B2 | 9/2013 | Dang et al. | |
| 9,070,586 B1 | 6/2015 | Dang et al. | |
| 9,200,883 B2 | 12/2015 | Andry et al. | |
| 2001/0050574 A1* | 12/2001 | Akram | G01R 1/06738 324/756.02 |
| 2004/0217767 A1* | 11/2004 | DiOrio | G01R 1/0483 324/754.03 |
| 2006/0022690 A1* | 2/2006 | Malantonio | G01R 1/07307 438/613 |
| 2012/0279287 A1 | 11/2012 | Andry et al. | |
| 2014/0167808 A1* | 6/2014 | Bartley | G01R 31/2884 324/762.03 |
| 2016/0084882 A1 | 3/2016 | Dang et al. | |
| 2016/0111387 A1 | 4/2016 | Dang et al. | |

* cited by examiner

INTEGRATED SELF-COINING PROBE

BACKGROUND

The present application relates to probe-based technologies, and more particularly to a probe head that contains a coining surface and a plurality of probe tips, each of which is integrated on a same side of the probe head.

As is well known in the art, typical semiconductor integrated circuit (IC) chips have layers stacked such that layer features overlay one another to form individual devices and connect devices together. ICs are mass produced by forming an array of chips on a semiconductor wafer. Each array location is known as a die, and each die may harbor a multilayered structure, such as an IC chip or a structure for test or alignment. The surface layer of each chip or die is typically populated by probe-able off-chip pads for connecting to chip power and input/output (I/O) signals.

As transistor technologies have evolved, chip features and devices have become smaller and have minimum dimensions that typically are well below one micrometer (1 µm) or 1 micron. Smaller chip features and devices allow IC manufacturers to integrate more function in the same chip real estate. Packing more function on each die typically means providing more I/O signals and power connections for each die. Each die has at least one surface pad for each I/O signal and a number of power (supply and ground) connection pads. Providing these I/O signals and supply as the die are shrinking in size, therefore, drives more stringent off-chip connection requirements, i.e., increasingly dense pad arrays. On a typical state of the art IC wafer, for example, the surface layer of each die may be populated by several thousand connection pads, arranged in an area array. As the number of connection pads increases for a given die size, the pitch of the pads decreases from a standard of about 200 microns, to below 50 microns.

Further, these very densely packed chip pads may also be populated with solder balls, also known as bumps, which are typically composed of lead-tin (PbSn) solder or lead-free solder. The solder balls are formed or bumped onto the pads forming non-uniform height bump arrays which are difficult to test with existing compliant probes. For example, some probes may fully "bottom out" during the testing of the bump arrays, while other probes may not make sufficient contact with the some of the bumps within the bump array. Variation in the height and mechanical properties of these probes requires them to be very compliant, resulting in structures which can be damaged by physical contact or by passing high electrical current. The manufacturing cost of these probes is high, and repair of these probes is difficult. As the pitch decreases, both the probe manufacturing cost and cost of repair increases rapidly, with no known solutions for area array pitches below 50 microns.

Also, the non-uniform height bump arrays may cause damage to the probe and/or damage to the bumps themselves may occur with existing probe technology. There are two root causes of bump non-uniformity. The deposition rate of the plating process used to deposit the bumps depends on the local density of bumps, resulting in different bump heights near the edges of the die and other locations where there are variations in the bump array density. To some extent, this effect is moderated by the fact that as the pitch decreases, the size of the bumps also decreases, resulting in a relatively smaller plating non-uniformity. A second cause is photo-lithographic variation in the via size which defines the bump area to be plated. As the pitch decreases, the relative variation in bump size from this mechanism becomes larger.

An important consequence of decreasing pitch and increasing bump count per die is the force required to probe and achieve good electrical contact over the full array. For conventional compliant probe technology, forces in the range of 1 to 3 grams per pin are required. A standard die with 10,000 bumps would thus require 10 to 30 kg of force to probe. As the bump count per die increases to 100,000 bumps, the forces required are large enough to severely impact the chuck and stage movement portions of the probe station, as well as the probe card fixturing.

In view of the above, there is a need for providing a probe that can be used to test the various bumps of each bump array that are present on a surface of a semiconductor wafer that circumvents the problems associated with non-uniform bump arrays.

SUMMARY

A probe head that contains a coining surface and a plurality of probe tips integrated on a same side of the probe head is provided. The probe head has a first portion and a laterally adjacent second portion, wherein the first portion of the probe head contains the coining surface, and the second portion of the probe head contains the plurality of the probe tips. Each probe tip may, in some embodiments, extend outwards from a probe pedestal that is in contact with the second portion of the probe head. The probe head is traversed across the surface of a semiconductor wafer containing a plurality of solder bump arrays such that the coining surface contacts a specific array of solder bumps prior to contacting of the same specific array of solder bumps with the probe tips.

In one aspect of the present application, an apparatus for testing a surface of a semiconductor wafer is provided. In one embodiment of the present application, the apparatus includes a probe head having a first portion and a laterally adjacent second portion, wherein the first portion contains a coining surface, and the second portion contains a plurality of probe tips, wherein the coining surface and each of the probe tips are located on a same side of the probe head.

In another aspect of the present application, a method of testing a surface of a semiconductor wafer is provided. In one embodiment of the present application, the method may include providing an apparatus comprising a probe head having a first portion and a laterally adjacent second portion, wherein the first portion of the probe head contains a coining surface, and the second portion of the probe heard contains a plurality of probe tips, wherein the coining surface and each of the probe tips are located on a same side of the probe head. A semiconductor wafer containing at least a first area array of solder bumps and a second area array of solder bumps, which is spaced apart from the first area array of solder bumps, is positioned beneath the side of the probe head containing the coining surface and the probe tips. Next, the probe head is moved across the semiconductor wafer such that the coining surface flattens each solder bump of the first area array of solder bumps prior to flattening each solder bump of the second array of solder bumps, and wherein during the flattening of each solder bump of the second area array of solder bumps, the probe tips contact a flatten surface of each solder bump of the first area of solder bumps.

DETAILED DESCRIPTION

Figure 1:
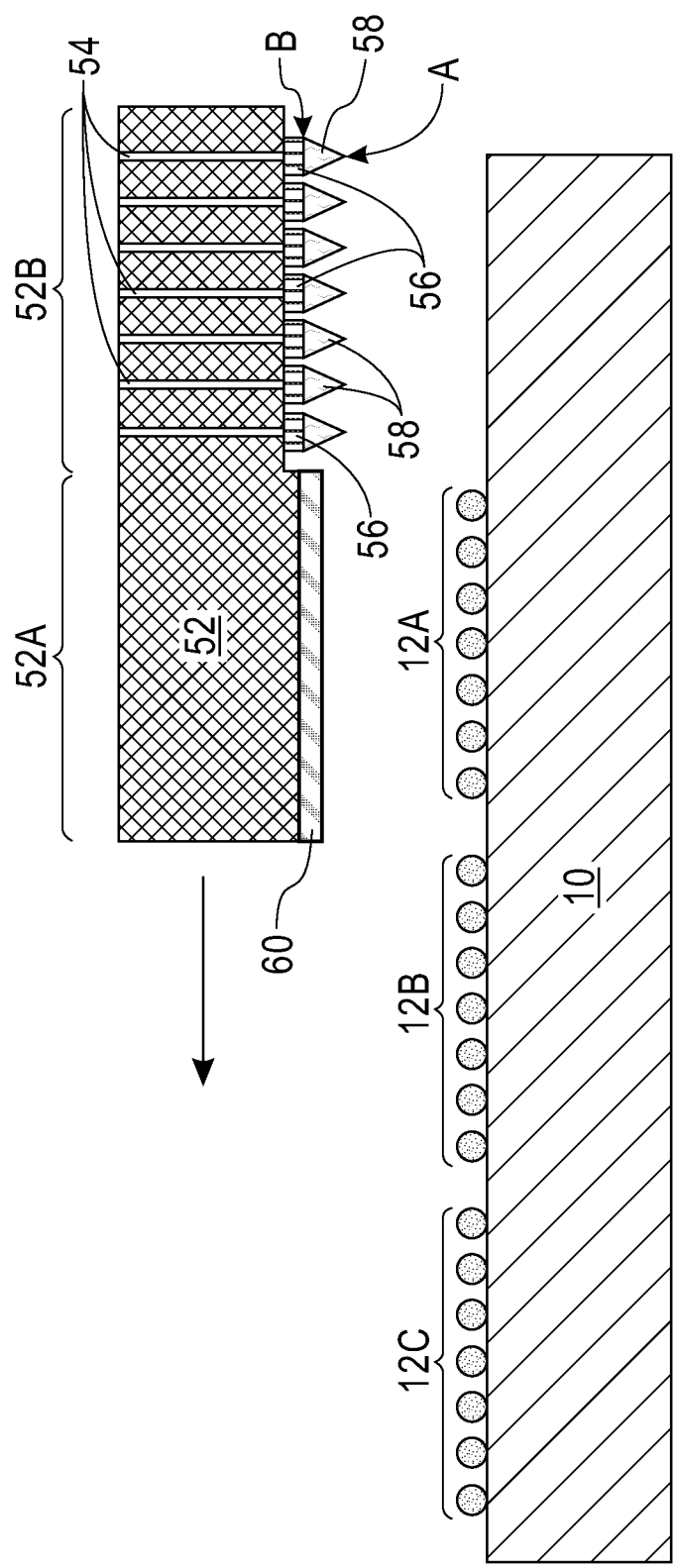
FIG. 1 is a cross sectional view of an apparatus of the present application positioned above a surface of a semiconductor wafer, the apparatus includes a probe head that contains a coining surface and a plurality of probe tips, each of which is integrated on a same side of the probe head.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a probe head that contains a coining surface and a plurality of probe tips integrated on a same side of the probe head. Thus, the probe head of the present application can provide the dual functions of coining (i.e., flattening or planarizing) and testing using a single apparatus. The probe head, as will be described in greater detail herein, has a first portion and a laterally adjacent second portion. The first portion of the probe head contains the coining surface, and the second portion of the probe head contains the plurality of the probe tips. Each probe tip may, in some embodiments, extend outwards from a probe pedestal that is in contact with the second portion of the probe head. The probe head is traversed across the surface of a semiconductor wafer containing a plurality of solder bump arrays such that the coining surface contacts a specific array of solder bumps prior to contacting of the same specific array of solder bumps with the probe tips.

Referring first to FIG. 1, there is illustrated an apparatus of the present application positioned above a surface of a semiconductor wafer 10. The apparatus includes a probe head 52 that contains a coining surface 60 located in a first portion 52A of the probe head 52, and a plurality of probe tips 58 located in a second portion 52B of the probe head 52. Although a single probe head 52 is described and illustrated, the apparatus may be designed to contain a plurality of probe heads 52.

As is shown, the coining surface 60 and each of the probe tips 58 are integrated on a same side of the probe head 52. Each probe head 52 that is present can move vertically (up and down) as well as horizontally (side to side). Although not shown, the probe head 52 may be wired to a probe card space transformer. The space transformer provides a series of electrical interconnections that accommodate the change in pitch from the probe head itself to the interconnection pitch which connects the probe card to electrical test equipment. Although not shown, the apparatus of the present application may be configured to a computer which can digitally store and record data provided via the probe tips 58.

In the present application, the coining surface 60 of the probe head 52 is used to coin (i.e., flatten or planarize) solder bumps present on a semiconductor wafer such that each flatten solder bump has a planar surface that is coplanar with the other flatten solder bumps. During use, the coining surface 60 of the probe head 52 is brought into intimate contact with solder bumps within an array of solder bumps and flattening of the solder bumps within the array of solder bumps occurs. Prior to coining with the coining surface 60, the solder bumps have a non-uniform height, while after coining with the coining surface 60, the coined solder bumps have a uniform height.

In one embodiment of the present application, the coining surface 60 and the probe head 52 are of unitary construction (i.e., one piece) and are made of a same material. In this embodiment, the coining surface 60 is planar and parallel to each probe tip 58, and represents a bottommost surface of a material that provides the probe head 52. In one example, the probe head 52 and the coining surface 60 can be composed of a semiconductor material having semiconducting properties. Examples of semiconductor materials that can be used as the probe head 52 and the coining surface 60 include, but are limited to, silicon, silicon germanium alloys, germanium, silicon carbide, III-V compound semiconductors or II-VI compound semiconductors. In one embodiment, the probe head 52 and the coining surface 60 are both composed of silicon.

In another example, the probe head 52 and the coining surface 60 that are of unitary construction may be composed of other materials such as for example, a dielectric material or a refractory metal. In one example, the probe head 52 and the coining surface 60 made be composed of silicon nitride.

In some embodiments of the present application, the probe head 52 and the coining surface 60 are two separate components, i.e., the probe head 52 and the coining surface 60 are composed of different materials. In such an embodiment, the coining surface 60 is planar and parallel to each probe tip 58, and represents a bottommost surface of a material layer that is added to the first portion 50A of the probe head 52. In one example, the material layer that can be added to the probe head 52 and that provides the coining surface 60 is one of a dielectric material, a refractory metal or a semiconductor material with the proviso that the material layer that provides the coining surface 60 is different in composition than the probe head 52. In one example, and when the probe head 52 is composed of silicon, the coining surface 60 may be a dielectric material such as, for example, silicon dioxide or silicon nitride. In another example, and when the probe head 52 is composed of silicon, the coining surface 60 may be a refractory metal such as, for example, tungsten. In yet another example, and when the probe head 52 is composed of silicon, the coining surface 60 may be composed of a silicon germanium alloy, silicon carbide, or a III-V compound semiconductor such as, for example, GaAs.

In this embodiment in which the coining surface 60 represents a bottommost surface of a material layer that is added to the first portion 50A of the probe head 52, the material layer that provides the coining surface 60 can be formed utilizing a deposition process such as, for example, chemical vapor deposition (CVD), plasma enhanced chemical vapor deposition (PECVD), atomic layer deposition (ALD), physical vapor deposition (PVD), or plating. In some embodiments, the material layer that provides the coining surface 60 can be formed utilizing a thermal growth process such as for example, thermal oxidation and/or thermal nitridation. In yet other embodiments, and when a semiconductor material is used as the material layer that provides the coining surface 60, the semiconductor material that provides the coining surface 60 may be formed by an epitaxial growth process. In some embodiments and following the deposition or growth of the material layer that provides the coining surface 60, a planarization process such as, for example chemical mechanical polishing and/or grinding can be used. In this embodiment of the present application, the material layer that provides the coining surface 60 may have a thickness from 0.1 µm to 10 µm; other thicknesses are possible and are not excluded from being used in the present application.

In the present application, the coining surface 60 of the probe head 52 is configured to be located in front of the probe tips 58 which are present in the second portion 52B of the probe head 52. Thus, flattening of the solder bumps with coining surface 60 occurs prior to testing the solder bumps with the probe tips 58.

In some embodiments and as is shown, each probe tip 58 extends outwards from a probe pedestal 56 which is attached to the second portion 52B of the probe head 52. Collectively, the combination of a single probe tip 58 and a single probe pedestal 56 may be referred to as a probe tip structure. In other embodiments of the present application (not shown), the probe pedestals 56 may be omitted and the probe tips are positioned directly upon a surface within the second portion 52B of the probe head 52. In such an embodiment, the probe tip 58 provides the entirety of the probe tip structure.

In embodiments in which probe pedestals are included, each probe tip 58 is composed of a first metal and each probe pedestal 56 is composed of a second metal that differs in composition from the first metal. In this embodiment, the first and second metals are selected from Ni, Cu, W, Co, Ti, Fe, Ta, TaN, Pt, Pd, Au, Mo, Re, Be, In, Sn or Ag with the proviso that the first and second metals are different from one another. In other embodiments, in which no probe pedestals 56 are present, each probe tip 58 includes Ni, Cu, W, Co, Ti, Fe, Ta, TaN, Pt, Pd, Au, Mo, Re, Be, In, Sn or Ag.

Each probe tip 58 may have a pyramidal shape comprising an apex, A, and a base, B, wherein the base, B, of each probe tip 58 is in direct contact with a surface of one of the probe pedestals 56 or a desired surface of the probe head 52 within the second portion 52B. In the present application, the apex, A is distal portion of each probe tip 58. In the present application, each apex, A, of each probe tip 58 is parallel with the coining surface 60.

Each probe pedestal 56 is located on a surface of the probe head 52 that may be vertically off-set from, but parallel with, a surface of the probe head 52 containing the coining surface 60. The surface that contains probe tip structure can be formed by recessing the second portion 52B of the probe head 52 prior to attaching the probe tip structures to the second portion 52B of the probe head 52. Recessing may be performed utilizing an etching process. A block mask may be formed over the first portion 52A of the probe head 52 during the etching process. Recessing may occur prior to, or after forming the coining surface 60. In some embodiments, no recessing in the second portion 52B of the probe head 52 is performed. Vertically offset may be achieved by the thickness of the added material layer that provides the coining surface 60.

Each probe tip 58 can be formed by first providing a mold that contains the shape of at least one probe tip. In one embodiment, the mold may be composed of single crystalline silicon. In such an embodiment, a single crystalline silicon wafer can first be providing, and then various etching processes can be used to provide the shapes of the probe tips into the single crystalline silicon wafer. If a silicon wafer with (100) orientation is used to make the mold using anisotropic etching, the mold is a 4-sided pyramid shape, bounded by (111) planes with a precise apex cone angle of 70.529 degrees. In this case, if a square via shape is used to define the mold, the depth of the mold pit is given by 0.7071 w, where w is length of the sides of the square. Other materials including for example, ceramics, can be used as the mold so long as the selected mold material is mechanically robust, and that the shape of the probe tips can be formed into the mold material. After providing the mold, the mold containing the shape of the probe tips can be filled with a metal (as described above) utilizing a deposition process such as, for example, plating. Next, the metallic probe tips are released from the mold during bonding and transfer of the probe tips to the desired surface of the probe head.

When present the probe pedestals 56 can be formed utilizing a plating process. When present, the probe tips 58 are attached to the probe pedestals 56 utilizing a solder metal which can complete the release of the probe tips 56 from the mold. Another solder metal can be applied to each probe pedestal 56 and thereafter the probe tip structure can be applied to the desired surface of the probe head 52.

The metallic probe tips and, if present, metallic probe pedestals are applied after recessing of the surface of probe head 52 in the second portion 52B. The application of the metallic probe tips and, if present, the metallic probe pedestals may be performed either before or after forming the coining surface 60.

As is further shown in FIG. 1, a plurality of metallic lines 54 (i.e., Through-Silicon-Vias or Through-Substrate-Vias, TSVs) is located in the second portion 52B of the probe head 52. The metallic lines 54 extend from the side of the probe head 52 containing the probe tips 58 to another side of the probe head 52 opposite the side containing the probe tips 58. The metallic lines 54 can be formed by etching a via opening into the probe head 52 and then filling the via opening with a metal such as, for example, Cu, Al, W or a Al—Cu alloy. In some embodiments, the metallic lines 54 are formed prior to recessing the second portion 52B of the probe head 52. In another embodiment, the metallic lines 54 are formed after recessing the second portion 52B of the probe head 52, but prior to probe tip structure attachment. The metallic lines 54 can be formed either prior to, or after, forming the coining surface 60. As is shown in the drawing, one end of each metal line 54 is in direct contact with a surface of one of the pedestal portions 58; the other end of the metal line 54 is coplanar with a surface of the probe head 52 that is on the side of the probe head 52 opposite the coining surface 60 and probe tip structures.

FIG. 1 further shows a semiconductor wafer 10 positioned beneath the side of the probe head 52 containing the coining surface 60 and probe tips 58. The semiconductor wafer 10 contains at least a first area array of solder bumps 12A and a second area array of solder bumps 12B spaced apart from the first area array of solder bumps 12A; a third array of solder bumps 12C is also shown in FIG. 1. Each solder bump array (12A, 12B, 12C) is formed in a die region of the semiconductor wafer 10. Each solder bump within the various arrays of solder bumps may include any well known solder material including, but not limited to, Sn, AuSn, SnAg, PbSn, SnAgCu or In. Prior to contacting with the coining surface 60 of the probe head 52 of the present application, the individual solder bumps within each array of solder bumps (e.g., 12A, 12B, 12C) have a non-uniform height.

The semiconductor wafer 10 may collectively include a semiconductor substrate including a plurality of semiconductor devices such as, for example transistors, capacitor, and/or diodes, located on different portions of the semiconductor substrate, a plurality of back-of-the-line interconnect levels including conductive features formed within dielectric materials is located above the semiconductor substrate and the semiconductor devices, and a far-back-of the line structure including a plurality of solder bond pads is located above the various back-of-the-line interconnect levels. The semiconductor wafer 10 thus contains an array of IC chips located thereon, wherein each array location is known as a die. The semiconductor wafer 10 containing the various arrays of solder bumps (12A, 112B 12C) can be formed utilizing techniques well known to those skilled in the art.

In the present application, testing of the solder bumps occurs by moving the probe head 52 across the semiconductor wafer 10 such that the coining surface 60 flattens each solder bump of a first area array of solder bumps (e.g., 12A) prior to flattening each solder bump of the second array of solder bumps (e.g., 12B), and wherein during the flattening of each solder bump of the second area array of solder bumps (e.g., 12B), the probe tip 58 contacts a flatten surface of each solder bump of the first area of solder bumps (e.g., 12A). In FIG. 1, the arrow shows the direction of horizontal movement of the probe head 52. The probe tips 58 penetrate the solder bumps and provide electrical contact to the die under test (DUT). The required bump penetration depth depends on the electrical current required to perform the test, with typical values between approximately 0.1 μm to 20 μm. The sharpness of the probe tips 58, as previously described, allows penetration of the bumps with low force, thus allowing simultaneous coining of the adjacent bumps without excessive total force.

Figure 2:
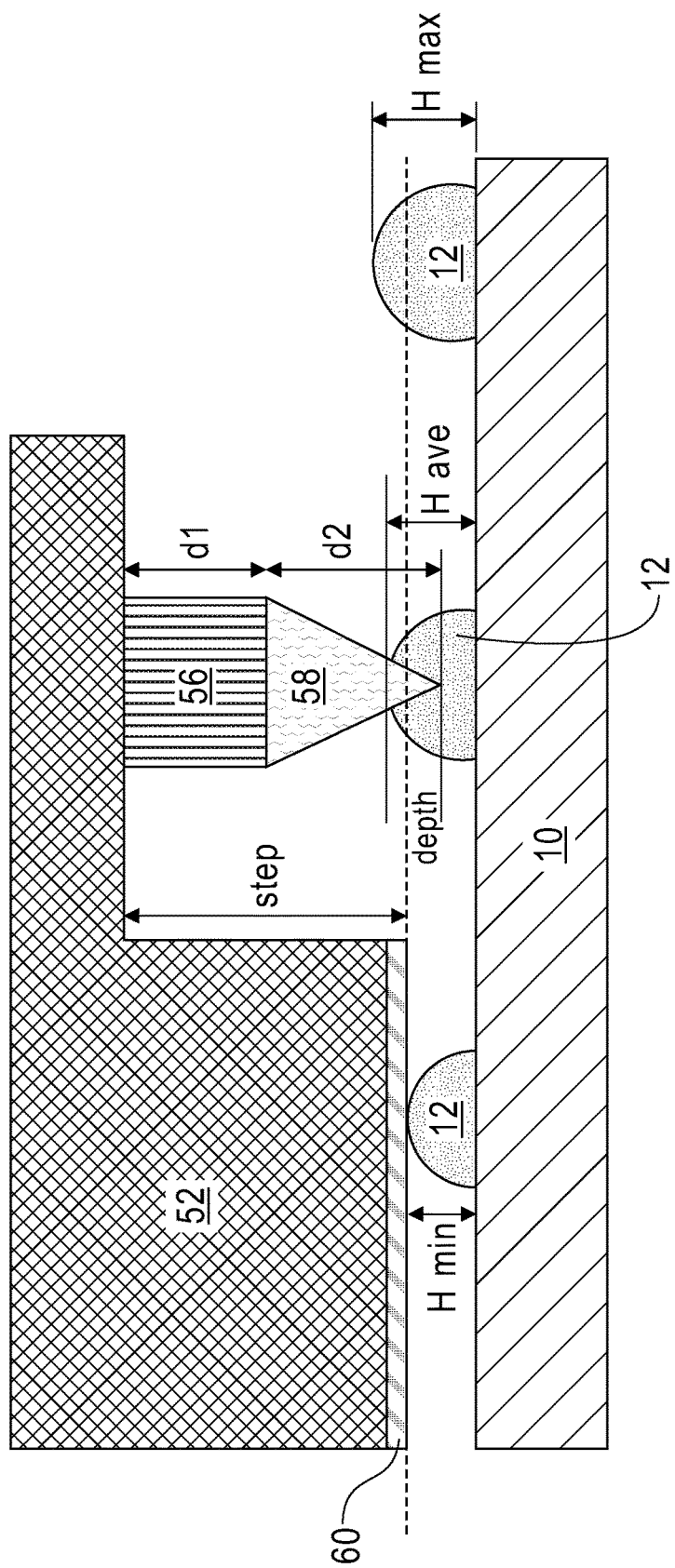
FIG. 2 is enlarged view of the apparatus showing a portion of the probe head and a portion of the semiconductor wafer, and detailing the coining surface height.

It is noted that the coined height of each flattened solder ball is set to ensure uniform probe tip 58 penetration. This aspect of the present application is described in more detail by referring to FIG. 2. Notably, FIG. 2 is an enlarged view of the apparatus shown in FIG. 1 above a semiconductor wafer 10 containing solder balls 12. In FIG. 2, 'step' denotes the difference between the off-set surface containing the probe tip structures and the coining surface, d1 represents the height of the probe pedestal 56, d2 represents the height of the probe tip 58, H min represents a minimum height of a solder ball within an array of solder balls, H max represents a maximum height of a solder ball within the array of solder balls, H ave represents an average height of a solder ball within the array of solder balls, and depth represents the target depth of penetration of the probe tips 58 into each solder ball.

In the present application, the target depth of penetration of the probe tips is set for the average bump height. Such a target depth can be determined using the following formula: Step distance=pedestal height+tip height-target depth+(H ave−H min) and solving for target depth.

In the present application, and for an exemplary bump pitch of 50 microns, the "step" may range from 0 to 50 μm, d1 may range from 0 to 45 μm, d2 may range from 1 μm to 20 m, H min may range from 2 μm to 20 μm, H ave may range from 3 μm to 25 μm, H max may range from 4 μm to 30 μm, and the depth of probe tip penetration by range from 0.1 μm to 20 μm. Other dimensions are possible and are not excluded from being used in the present application.

Figure 3:
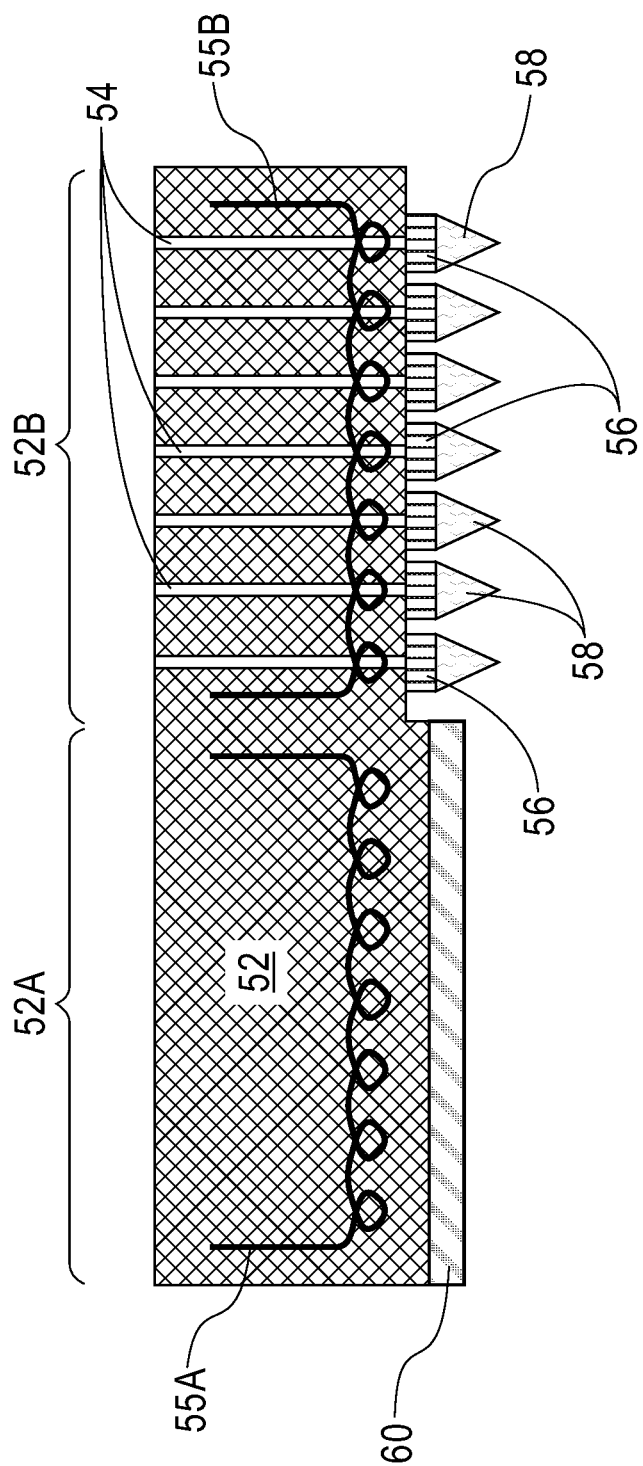
FIG. 3 is a cross sectional view of another apparatus of the present application, the another apparatus includes a probe head that contains a coining surface, a plurality of probe tips, each of which is integrated on a same side of the probe head, and heating elements located within the probe head.

Referring now to FIG. 3, there is illustrated another apparatus of the present application. The another apparatus includes a probe head 52 that is similar to the probe head 52 shown in FIG. 1 except that heating elements 55A, 55B are located within the first portion 52A and the second portion 52B of the probe head 52. In addition to the heating elements 55A, 55B, the probe head 52 of this embodiment includes a coining surface 60 as mentioned above for the previous embodiment of the present application, probe tip structures as mentioned above for the previous embodiment of the present application, and metallic lines 54 as also mentioned above for the previous embodiment of the present application.

In one embodiment, and as is illustrated, a heating element 55A is located in the first portion 52A of the probe head 52, and another heating element 55B is located in the second portion 52B of the probe head 52. In other embodiment, heating element 55A is the only heating element present the probe head 52. In yet another embodiment, heating element 55B is the only heating element present in the probe head 52.

Heating elements 55A, 55B that can be employed in the present application include any conventional heating element that can convert electricity into heat through the process of resistive or Joule heating. Electric current passing through the element encounters resistance, resulting in heating of the element. The heating elements 55A, 55B that can be employed in the present application include, for example, metal heating elements, ceramic heating elements, and conducting polymers. In one example, metal coils are used as the heating elements 55A, 55B.

In embodiments in which heating elements 55A, 55B are present, the heating elements 55A, 55B can be used to facilitate the softening of the solder bumps that are present on a semiconductor wafer. Notably, heating element 55A helps to soften the solder bumps during the coining process, while heating element 55B helps to soften the solder bumps during the testing process.

In some embodiments of the present application, heating elements 55A, 55B can provide a temperature from 20° C. to 250° C. Other temperatures are possible and are not excluded from the present application. In some embodiments, the heating elements 55A, 55B can be formed inside the probe head 52 utilizing techniques well known in the art. In other embodiments, the heating elements 55A, 55B can be provided to an outermost surface of the probe head 52.

FIGS. 1 and 3 above illustrate probe heads 52 that contain a coining element (i.e., the coining surface 60) and testing element (i.e., probe tip structures) integrated on the same side of the probe head 52. The probe head 52 of the present application can be used to overcome the non-uniformity height issue on solder balls by first coining the solder balls to have a uniform height using the coining surface 60 and thereafter testing the coined solder balls with the probe tip structures.

The probe heads 52 are not limited to coining and testing solder balls on a semiconductor wafer. Instead, the probe head of the present application can be used in other application in which coining and testing are both needed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of testing a surface of a semiconductor wafer, said method comprising:
providing an apparatus comprising a probe head having a first portion and a laterally adjacent second portion, wherein said first portion of said probe head contains a coining surface, and said second portion of said probe head contains a plurality of probe tips, wherein said coining surface and each of said probe tips are located on a same side of said probe head;
positioning said semiconductor wafer beneath said side of said probe head containing said coining surface and said probe tips, said semiconductor wafer containing at least a first area array of solder bumps and a second area array of solder bumps spaced apart from said first area array of solder bumps; and
moving said probe head across said semiconductor wafer such that said coining surface flattens each solder bump of said first area array of solder bumps prior to flattening each solder bump of said second array of solder bumps, and wherein during said flattening of each solder bump of said second area array of solder bumps, said probe tip contacts a flatten surface of each solder bump of said first area of solder bumps.

2. The method of claim 1, wherein said coining surface is planar and parallel to each of said probe tips, and said coining surface represents a bottommost surface of a material that provides said probe head.

3. The method of claim 1, wherein said coining surface is planar and parallel to each of said probe tips, and said coining surface represents a bottommost surface of a material layer that is added to said first portion of said probe head.

4. The method of claim 1, wherein each probe tip extends outwards from a probe pedestal.

5. The method of claim 4, wherein each probe tip comprises a first metal and each probe pedestal comprises a second metal that differs from said first metal, and said first and second metals are selected from the group consisting of Ni, Cu, W, Co, Ti, Fe, Ta, TaN, Pt, Pd, Au, Mo, Re, Be, Sn, In and Ag.

6. The method of claim 1, wherein each probe tip has a pyramidal shape comprising an apex and a base.

7. The method of claim 1, further comprising metallic lines located in said second portion of said probe head, wherein each metallic line extends from said side of the probe head containing said probe tips to another side of said probe head opposite said side containing said probe tips.

8. The method of claim 1, further comprises a heating element present in at least one of said first portion and said second portion of said probe head.

* * * * *